(12) United States Patent
Meitl et al.

(10) Patent No.: US 11,705,439 B2
(45) Date of Patent: Jul. 18, 2023

(54) LED COLOR DISPLAYS WITH MULTI-LED SUB-PIXELS

(71) Applicant: X Display Company Technology Limited, Dublin (IE)

(72) Inventors: Matthew Alexander Meitl, Durham, NC (US); Christopher Andrew Bower, Raleigh, NC (US); Ronald S. Cok, Rochester, NY (US); Brook Raymond, Cary, NC (US)

(73) Assignee: X Display Company Technology Limited, Dublin (IE)

( * ) Notice: Subject to any disclaimer, the term of this patent is extended or adjusted under 35 U.S.C. 154(b) by 192 days.

(21) Appl. No.: 17/157,886

(22) Filed: Jan. 25, 2021

(65) Prior Publication Data
US 2021/0242180 A1 Aug. 5, 2021

Related U.S. Application Data

(63) Continuation of application No. 16/778,948, filed on Jan. 31, 2020, now Pat. No. 11,037,912.

(51) Int. Cl.
*H01L 29/20* (2006.01)
*H01L 33/00* (2010.01)
*H01L 25/075* (2006.01)
*H01L 25/16* (2023.01)
*H01L 33/62* (2010.01)

(52) U.S. Cl.
CPC ........ *H01L 25/0753* (2013.01); *H01L 25/167* (2013.01); *H01L 33/62* (2013.01); *H01L 2933/0066* (2013.01)

(58) Field of Classification Search
CPC ... H01L 25/0753; H01L 25/167; H01L 33/62; H01L 2933/0066
See application file for complete search history.

(56) References Cited

U.S. PATENT DOCUMENTS

| | | | |
|---|---|---|---|
| 6,142,358 | A | 11/2000 | Cohn et al. |
| 7,195,733 | B2 | 3/2007 | Rogers et al. |
| 7,354,801 | B2 | 4/2008 | Sugiyama et al. |
| 7,521,292 | B2 | 4/2009 | Rogers et al. |
| 7,557,367 | B2 | 7/2009 | Rogers et al. |
| 7,622,367 | B1 | 11/2009 | Nuzzo et al. |

(Continued)

OTHER PUBLICATIONS

Bower, C. A. et al., Emissive displays with transfer-printed assemblies of 8 μm ×15 μm inorganic light-emitting diodes, Photonics Research, 5(2):A23-A29, (2017).

(Continued)

*Primary Examiner* — Ismail A Muse
(74) *Attorney, Agent, or Firm* — Choate, Hall & Stewart LLP; Michael D. Schmitt

(57) ABSTRACT

A multi-color LED display comprises pixels, each comprising a first sub-pixel, a second sub-pixel, and a third sub-pixel. The first sub-pixel comprises a first light-emitting diode (LED) that emits a first color of light, the second sub-pixel comprises second LEDs that emit a second color of light different from the first color of light, and the third sub-pixel comprises third LEDs that emit a third color of light different from the first color of light and different from the second color of light. The second LEDs are electrically connected in parallel and the third LEDs are electrically connected in series.

16 Claims, 12 Drawing Sheets

(56) References Cited

U.S. PATENT DOCUMENTS

| | | |
|---|---|---|
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibl et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,818,725 B2 | 11/2017 | Bower et al. |
| 9,865,832 B2 | 1/2018 | Bibl et al. |
| 9,929,053 B2 | 3/2018 | Bower et al. |
| 10,395,582 B2 | 8/2019 | Cok et al. |
| 10,453,826 B2 | 10/2019 | Raymond et al. |
| 11,037,912 B1 | 6/2021 | Meitl et al. |
| 2003/0141570 A1 | 7/2003 | Chen et al. |
| 2008/0260583 A1 | 10/2008 | Johnson et al. |
| 2010/0306993 A1 | 12/2010 | Mayyas et al. |
| 2011/0012533 A1* | 1/2011 | Lee .................... H05B 45/28 315/297 |
| 2011/0210251 A1 | 9/2011 | Onakado et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2014/0168037 A1 | 6/2014 | Sakariya et al. |
| 2016/0093600 A1 | 3/2016 | Bower et al. |
| 2017/0270852 A1 | 9/2017 | Meitl et al. |
| 2017/0338374 A1 | 11/2017 | Zou et al. |
| 2017/0352647 A1 | 12/2017 | Raymond et al. |
| 2018/0007750 A1 | 1/2018 | Meitl et al. |
| 2018/0198020 A1 | 7/2018 | Lai et al. |
| 2018/0226386 A1 | 8/2018 | Cok |
| 2018/0323180 A1 | 11/2018 | Cok |
| 2018/0350291 A1 | 12/2018 | Wu et al. |
| 2020/0119106 A1* | 4/2020 | Kim .................. H01L 27/3218 |
| 2020/0126473 A1 | 4/2020 | Chibashi et al. |
| 2020/0127060 A1 | 4/2020 | Li et al. |
| 2020/0144335 A1 | 5/2020 | Quan et al. |
| 2020/0258938 A1 | 8/2020 | Chai et al. |
| 2020/0287165 A1 | 9/2020 | Peckham et al. |
| 2020/0333674 A1 | 10/2020 | Zhao et al. |
| 2020/0350375 A1 | 11/2020 | Zhu et al. |
| 2020/0357335 A1 | 11/2020 | Yu |
| 2020/0403129 A1 | 12/2020 | Lee et al. |
| 2020/0403131 A1 | 12/2020 | Kim et al. |
| 2022/0293712 A1* | 9/2022 | Park ...................... H01L 51/52 |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer, J. W. et al., 63:2: AMOLED Displays using Transfer-Printed Integrated Circuits, SID, 09:947-950, (2009).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

LED COLOR DISPLAYS WITH MULTI-LED SUB-PIXELS

PRIORITY APPLICATION

This application is a continuation of U.S. patent application Ser. No. 16/778,948, filed on Jan. 31, 2021, the disclosure of which is hereby incorporated by reference in its entirety.

CROSS REFERENCE TO RELATED APPLICATION

Reference is made to U.S. Pat. No. 10,453,826, entitled Voltage-Balanced Serial ILED Pixel and Display, the disclosure of which is incorporated herein by reference in its entirety.

TECHNICAL FIELD

The present disclosure relates to displays with light-emitting diode pixels.

BACKGROUND

Large-format inorganic light-emitting diode (iLED) displays are used in outdoor and stadium displays. Because the iLEDs are relatively large, for example one square millimeter in size, they are restricted to relatively low-resolution displays. However, as iLED technology develops, there is increasing interest in applying smaller iLEDs to displays having higher resolution. Full-color displays typically include pixels with three (or more) emitters, usually red, green, and blue emitters (and sometimes others, like yellow emitters), distributed in an array over the display surface. For example, inorganic light-emitting diodes used in flat-panel displays are disclosed in U.S. Pat. No. 9,818,725 entitled Inorganic-Light-Emitter Display with Integrated Black Matrix.

Inorganic light-emitting diodes are semiconductor light sources relying on p-n junctions to emit light when a suitable voltage is applied across the light-emitting diode. The color of the light emitted from the iLED corresponds to the energy bandgap of the semiconductor used. Thus, different semiconductor materials can produce different colors of light when stimulated with suitable voltages. Typical materials include InGaN (emitting blue light), AlGaP (emitting green light), and AlGaAs (emitting red light), among many other materials, including quaternary compounds of III-V and II-VI group elements. Generally, blue-light-emitting materials can emit light at voltages ranging from 2.5-3.7 volts, green-light-emitting materials can emit light at voltages ranging from 1.9-4 volts, and red-light-emitting materials can emit light at voltages ranging from 1.6-2 volts, for example as taught in U.S. Pat. No. 10,453,826, entitled Voltage-Balanced Serial ILED Pixel and Display. Moreover, the efficiency with which the different materials emit light can depend on the density of the current passing through the materials.

SUMMARY

In order to provide the different voltages and currents needed by the different light-emitting diodes emitting different colors of light in a full-color pixel, a separate power supply can supply power, ground, and control signals to each color light emitter in each multi-color pixel. By supplying the appropriate voltages and currents to each light emitter, the light emitters efficiently emit light. However, providing three (or more) different power, ground, and control signals to each multi-color pixel requires three times as many power supplies, lines, and connections, reducing the available space in the display and increasing costs.

Alternatively, a single power supply can provide power to all three different iLEDs in the full-color pixels. In this case any excess voltage is dropped across other circuit components, increasing heat and reducing overall display system power efficiency.

The present disclosure provides displays and pixel structures with reduced circuitry that can have improved power efficiency. According to some embodiments of the present disclosure, a multi-color light-emitting diode (LED) display comprises pixels that each comprise a first sub-pixel, a second sub-pixel, and a third sub-pixel. The first sub-pixel comprises a first light-emitting diode (LED) that emits a first color of light, the second sub-pixel comprises second LEDs that emit a second color of light different from the first color of light, and the third sub-pixel comprises third LEDs that emit a third color of light different from the first color of light and different from the second color of light. The second LEDs are electrically connected in parallel and the third LEDs are electrically connected in series.

In some embodiments, the first sub-pixel comprises one or more (e.g., two) first LEDs and at least two of the first LEDs are electrically connected in series, at least two second LEDs are electrically connected in parallel, and at least two third LEDs are electrically connected in series. In some embodiments, the first sub-pixel comprises more than two first LEDs and at least two of the first LEDs are electrically connected in series. In some embodiments, all of the first LEDs are electrically connected in series. In some embodiments, the second sub-pixel comprises more second LEDs than the first sub-pixel comprises first LEDs and the third sub-pixel comprises more third LEDs than the first sub-pixel comprises first LEDs. In some embodiments, the third sub-pixel comprises more third LEDs than the second sub-pixel comprises second LEDs. In some embodiments, at least two of the first LEDs are electrically connected in parallel, more than two second LEDs are electrically connected in parallel, and more than two third LEDs are electrically connected in series. In some embodiments, three third LEDs are electrically connected in parallel, four third LEDs are electrically connected in parallel, or all of the third LEDs are electrically connected in parallel, or any combination of these.

In some embodiments, the one or more first LEDs are more efficient than the second LEDs and the second LEDs are more efficient than the third LEDs at any current or current density or at a given current or current density. As used herein, an efficiency for any one or more of the first, second, or third LEDs can be a ratio of the number or energy of the photons emitted from an LED to the electrical power used by the LED (e.g., Watts). Efficiency can be the LED external or internal quantum efficiency. Efficiency can be a current efficiency or the efficiency with which an LED transforms electrical current or electrical power into light. A current density is a ratio of the current passing through a light-emitting area or volume of an LED to the light-emitting area or volume of the LED.

One or more first LEDs can each have a first efficiency that is current dependent, the second LEDs can each have a second efficiency that is current dependent, and the third LEDs can each have a third efficiency that is current dependent and the first, second, and third efficiencies can each be different at any or all currents. The first, second, and third efficiencies can each have a maximum value at a finite, positive, non-zero value and the first, second, and third efficiency maximums can each be different. According to embodiments, the second efficiency reaches a maximum (the second efficiency maximum) at a smaller current or current density than the current at which the first efficiency reaches a maximum (the first efficiency maximum). According to embodiments, the third efficiency reaches a maximum (the third efficiency maximum) at a larger current or current density than the second efficiency. According to embodiments, the third efficiency reaches a maximum at a larger current or current density than the current at which the first efficiency reaches a maximum.

According to some embodiments of the present disclosure, a multi-color LED display comprises pixels. Each of the pixels comprises a first sub-pixel, a second sub-pixel, and a third sub-pixel. The first sub-pixel comprises a first light-emitting diode (LED) that emits a first color of light, the second sub-pixel comprises a second LED that emits a second color of light different from the first color of light, and the third sub-pixel comprises a third LED that emits a third color of light different from the first color of light and different from the second color of light. The first LED has a first light-emitting area or volume, the second LED has a second light-emitting area or volume, and the third LED has a third light-emitting area or volume. The second light-emitting area or volume can be larger than the first light-emitting area or volume and the third light-emitting area or volume can be smaller than the first light-emitting area or volume or smaller than the second light-emitting area or volume, or both. Thus, in some embodiments, the second LED is larger than the first LED, the first LED is larger than the third LED, or both. In some embodiments, (i) the ratio of the second light-emitting area or volume to the first light-emitting area or volume is dependent on the ratio of the first efficiency maximum to the second efficiency maximum, (ii) the ratio of the second light-emitting area or volume to the first light-emitting area or volume is dependent on the ratio of the first efficiency maximum to the second efficiency maximum, or (iii) both (i) and (ii).

According to some embodiments, the second sub-pixel comprises two second LEDs and the two second LEDs are electrically connected in parallel. According to some embodiments, the second sub-pixel comprises three second LEDs and the three second LEDs are electrically connected in parallel.

According to some embodiments, the third sub-pixel comprises two third LEDs and the two third LEDs are electrically connected in series. According to some embodiments, the third sub-pixel comprises three third LEDs and the three third LEDs are electrically connected in series. According to some embodiments, the third sub-pixel comprises four third LEDs and the four third LEDs are electrically connected in series According to some embodiments, the third sub-pixel comprises five third LEDs and the five third LEDs are electrically connected in series. According to some embodiments, the third sub-pixel comprises six third LEDs and the six third LEDs are electrically connected in series.

Multi-color displays according to some embodiments of the present disclosure can comprise inorganic LEDs (iLEDs), for example micro-iLEDs. Any one or more of the first, second, and third LEDs can be micro-LEDs with a width or length that is no greater than 500 microns (e.g., no greater than 200 microns, no greater than 100 microns, no greater than 50 microns, no greater than 25 microns, no greater than 15 microns, no greater than 12 microns, no greater than 8 microns, or no greater than 5 microns). The first, second, and third LEDs can have or be different sizes, for example the first LED can be a different size from the second and the third LEDs, the second LEDs can be a different size from the first and the third LEDs, and the third LEDs can be a different size from the first and the second LEDs. In some embodiments, the first, second, and third LEDs are all different sizes, for example the second LED is larger than the first LED and the third LED is smaller than the first LED.

According to some embodiments of the present disclosure, the first one or more LEDs are blue LEDs that emit blue light, the second LEDs are green LEDs that emit green light, and the third LEDs are red LEDs that emit red light.

According to some embodiments of the present disclosure, (i) the first LED comprises a first compound semiconductor and the third LEDs comprise a compound semiconductor that is different from the first compound semiconductor, (ii) the second LEDs comprise a second compound semiconductor and the third LEDs comprise a compound semiconductor that is different from the second compound semiconductor, (iii) the first LED and the second LEDs comprise a common compound semiconductor, or (iv) any one or combination of (i), (ii), and (iii).

In some embodiments of the present disclosure, a multi-color display comprises a controller that controls the first LED, the second LEDs, and the third LEDs, and the controller provides a voltage and current to each of the first LED, the second LEDs, and the third LEDs. In some embodiments, the controller provides control signals to the first LED, the second LEDs, and the third LEDs. The controller can be a display controller that provides electrical signals to each of the first, second, and third LEDs. The controller can be a plurality of pixel controllers that each provides electrical signals to each of the first, second, and third LEDs in a pixel. Pixel controllers can be controlled by a display controller and the controller can comprise a display controller in combination with multiple pixel controllers.

According to embodiments of the present disclosure, a voltage provided to each individual third LED is less than the voltage provided to each of the first or second LEDs, is no greater than one half the voltage provided to each of the first or second LEDs, is no greater than one third the voltage provided to each of the first or second LEDs, or is no greater than one quarter of the voltage provided to each of the first or second LEDs. According to embodiments, the voltage provided to the first sub-pixel, the second sub-pixel, and the third sub-pixel is a same common voltage, but the voltage provided to each individual third LED is less than the voltage provided to each individual first LED or second LED or both first and second LEDs. In some embodiments, a common voltage is supplied to every sub-pixel in a pixel, for example a common voltage is provided to first, second, and third sub-pixels and, for example, to the sub-pixels of every pixel in display.

Similarly, according to embodiments of the present disclosure, a common current is provided to every sub-pixel in one or more pixels, for example a common current is provided to first, second, and third sub-pixels 31, 32, 33 in all pixels 20 in display 99. However, because one or more sub-pixels can each comprise multiple LEDs electrically connected in parallel, the current provided to each parallel-connected LED in a sub-pixel can be less than the common current provided to every sub-pixel in a pixel. For example, in some embodiments the current provided to each of the first LEDs is no less than twice the current provided to each of the second LEDs. In some embodiments the current provided to each of the third LEDs is no less than twice the current provided to each of the first or second LEDs. In some embodiments the current provided to each of the third LEDs is no less than three times the current provided to each of the first or second LEDs. In some embodiments the current provided to each of the third LEDs is no less than four times the current provided to each of the first or second LEDs.

According to some embodiments of the present disclosure, a display or pixel controller provides a current source at a fixed voltage to one or any combination of the first LED, the second LEDs, and the third LEDs, and the quantity of light emitted by the first LED, the second LEDs, and the third LEDs is controlled by the current provided to the first LED, the second LEDs, and the third LEDs, respectively. The display or pixel controller can provide temporally modulated current at a fixed quantity, for example in a pulse width modulation configuration to emit different amounts of light over time.

According to embodiments of the present disclosure, a multi-color display comprises a display substrate, an array of pixels disposed on the display substrate, and a controller connected to each of the pixels to control the pixel. A separate controller (e.g., a pixel controller) can be connected to each of the pixels to control the pixel.

According to some embodiments, a pixel, for example a display pixel, comprises a first sub-pixel, a second sub-pixel, and a third sub-pixel, the first sub-pixel comprising a first light-emitting diode (LED) that emits a first color of light, the second sub-pixel comprising second LEDs that emit a second color of light different from the first color of light, and the third sub-pixel comprising third LEDs that emit a third color of light different from the first color of light and different from the second color of light. The second LEDs are electrically connected in parallel and the third LEDs are electrically connected in series.

According to some embodiments, a pixel, for example a display pixel, comprises a first sub-pixel, a second sub-pixel, and a third sub-pixel, the first sub-pixel comprising a first light-emitting diode (LED) that emits a first color of light, the second sub-pixel comprising a second LED that emits a second color of light different from the first color of light, and the third sub-pixel comprising a third LED that emits a third color of light different from the first color of light and different from the second color of light. The second LED can be larger than the first LED. The first LED can be larger than the third LED. The size of an LED can be defined by any one or combination of the length and width of the LED, the light-emitting area, and the light-emitting volume of the LED.

Embodiments of the present disclosure provide a display and pixel control with simplified power and control circuits requiring fewer components and electrical connections together with improved light-output efficiency, for example light emitted from inorganic micro-light-emitting diodes.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
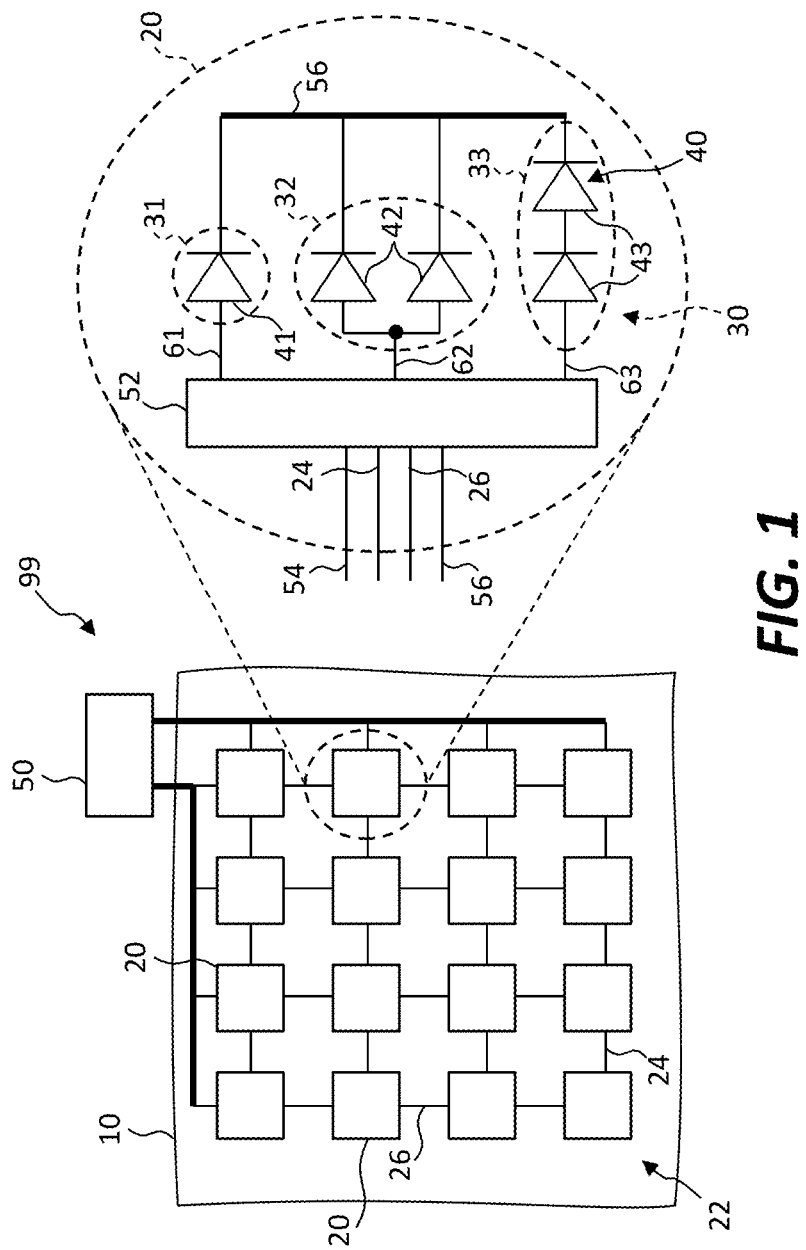
FIG. 1 is a schematic diagram and detail of a display according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present disclosure provide electrically connected iLEDs that have improved efficiency and simplified power and control circuitry. Such electrically connected iLEDs can be sub-pixels in one or more pixels in a display. In some embodiments, a power supply for a pixel (e.g., for all of the sub-pixels in a pixel together) provides any one or more of a single current supply, a single constant current supply, and a single voltage supply. According to some embodiments of the present disclosure and as illustrated in FIG. 1, a multi-color LED display 99 comprises pixels 20 on a display substrate 10. Pixels 20 can be arranged in an array 22, for example a regular, rectangular array, or in an irregular arrangement, and can comprise, for example, first, second, and third sub-pixels 31, 32, 33 (collectively sub-pixels 30), that each emit a different color of light at a desired luminance in response to control signals provided by a display controller 50 in display 99, for example in an active- or passive-matrix control configuration. In a matrix configuration, each pixel 20 can be controlled by row-control signals provided on row wire 24 and data signals provided on column wire 26. Active-matrix pixels 20 can each comprise a pixel controller 52 that controls first, second, and third sub-pixels 31, 32, 33 with first, second, and third current control signals 61, 62, 63 in response to signals provided on power, 54, ground 56, row wire 24, and column wire 26 signals. (A line with a relatively heavier weighting in the Figures indicates a bus comprising multiple wires, for example multiple row wires 24 or multiple column wires 26 electrically connected to display controller 50 or pixel controller 52.)

Display substrate 10 can have opposing parallel sides over or on one of which pixels 20 are disposed. For example, display substrate 10 can be a flat-panel substrate found in the display industry such as a glass, polymer, ceramic, metal, sapphire, or quartz substrate.

First, second, and third sub-pixels 31, 32, 33, can each comprise one or more light-emitting elements, such as inorganic light-emitting diodes (iLEDs 40). First sub-pixel 31 can comprise a first light-emitting diode (LED) 41 that emits a first color of light. Second sub-pixel 32 can comprise second LEDs 42 that emit a second color of light different from the first color of light. Third sub-pixel 33 can comprise third LEDs 43 that emit a third color of light different from the first color of light and different from the second color of light. Second LEDs 42 can be electrically connected in parallel and third LEDs 43 can be electrically connected in series.

In some embodiments of the present disclosure, first LED 41 is a blue LED that emits blue light, second LEDs 42 are green LEDs that emit green light, and third LEDs 43 are red LEDs that emit red light. In some embodiments, first, second, or third LEDs 41, 42, 43 can emit one or more other colors of light, for example yellow or cyan light. In some embodiments, display 99 comprises fourth sub-pixels that emit colors of light that are different from the colors of light emitted by first, second, or third LEDs 41, 42, 43, such as yellow or cyan light for example. According to some embodiments of the present disclosure, second LEDs 42 all emit substantially the same color of light (e.g., within manufacturing variability) and third LEDs 43 all emit substantially the same color of light (e.g., within manufacturing variability).

Figure 2:
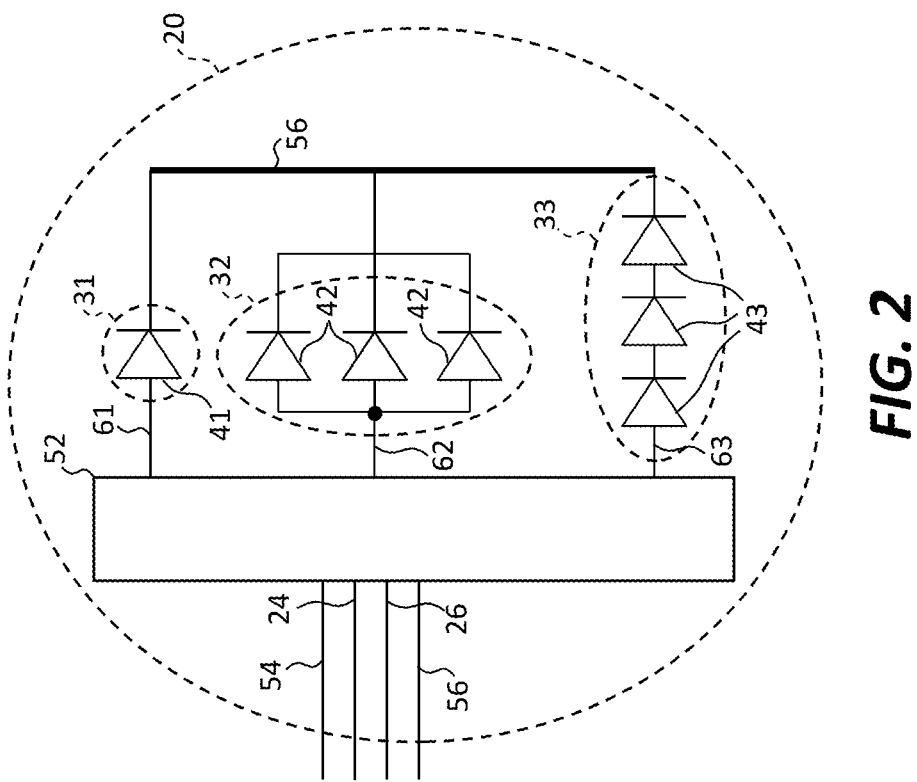
FIG. 2 is a schematic detail diagram of a pixel according to illustrative embodiments of the present disclosure.

As shown in FIG. 1, in some embodiments of the present disclosure, first sub-pixel 31 comprises only a single first LED 41, second sub-pixel 32 comprises only two second LEDs 42 electrically connected in parallel, and third sub-pixel 33 comprises only two third LEDs 43 electrically connected in series. As illustrated in FIG. 2, first sub-pixel 31 comprises only a single first LED 41, second sub-pixel 32 comprises only three second LEDs 42 electrically connected in parallel, and third sub-pixel 33 comprises only three third LEDs 43 electrically connected in series. More generally and as expressly contemplated herein, second sub-pixel 32 can comprise any number of second LEDs 42 greater than one and third sub-pixel 33 can comprise any number of third LEDs 43 greater than one, independent of the number of second LEDs 42. For example, second sub-pixel 32 can comprise two second LEDs 42 or three second LEDs 42 and third sub-pixel 33 can comprise three third LEDs 43 or four third LEDs 43.

According to some embodiments of the present disclosure, first, second, and third LEDs 41, 42, 43 are micro-LEDs 40 with at least one of a width and a length that is no greater than 500 microns (e.g., no greater than 200 microns, no greater than 100 microns, no greater than 50 microns, no greater than 25 microns, no greater than 15 microns, no greater than 12 microns, no greater than 8 microns, or no greater than 5 microns). First, second, and third LEDs 41, 42, 43 can have different sizes. Micro-LEDs 40 provide an advantage according to some embodiments of the present disclosure since they are sufficiently small and can be disposed spatially close together so that the different micro-LEDs 40 in a pixel 20 and sub-pixel 30 cannot be readily distinguished by the unaided human visual system in a display at a desired viewing distance, improving color mixing of light emitted by a pixel 20 and sub-pixel 30 and providing apparent improvements in display resolution. In some embodiments, a single common mask set can be used to construct all of first, second, and third LEDs 41, 42, 43 and all of first, second, and third LEDs 41, 42, 43 are the same size, reducing construction costs for pixels 20.

According to some embodiments, (i) first LED 41 comprises a first compound semiconductor, for example GaN or doped GaN, and third LEDs 43 comprise a third compound semiconductor that is different from the first compound semiconductor, for example GaAs or doped GaAs, (ii) second LEDs 42 comprise a second compound semiconductor, for example GaN or doped GaN, and third LEDs 43 comprise a third compound semiconductor that is different from the second compound semiconductor, for example GaAs or doped GaAs, (iii) first LED 41 and second LEDs 42 comprise a common compound semiconductor, for example GaN or doped GaN, or (iv) any one or combination of (i), (ii), and (iii).

Referring to FIGS. 1 and 2 and according to some embodiments of the present disclosure, display controller 50 (for example in a passive-matrix control configuration) or pixel controller 52 (for example in an active-matrix control configuration) controls first LED 41, second LEDs 42, and third LEDs 43 in at least one pixel (e.g., all pixels for a display controller in a passive-matrix control configuration or a single pixel in an active-matrix control configuration), provides a voltage and current to each of first LED 41, second LEDs 42, and third LEDs 43, and, optionally, provides a current source at a fixed voltage to one or any combination of first LED 41, second LEDs 42, and third LEDs 43 so that a quantity of light emitted by first LED 41, second LEDs 42, and third LEDs 43 is controlled by current provided to first LED 41, second LEDs 42, and third LEDs 43, respectively. LEDs 40 can be controlled using pulse width modulation to provide a variable LED 40 brightness over time.

Figure 3:
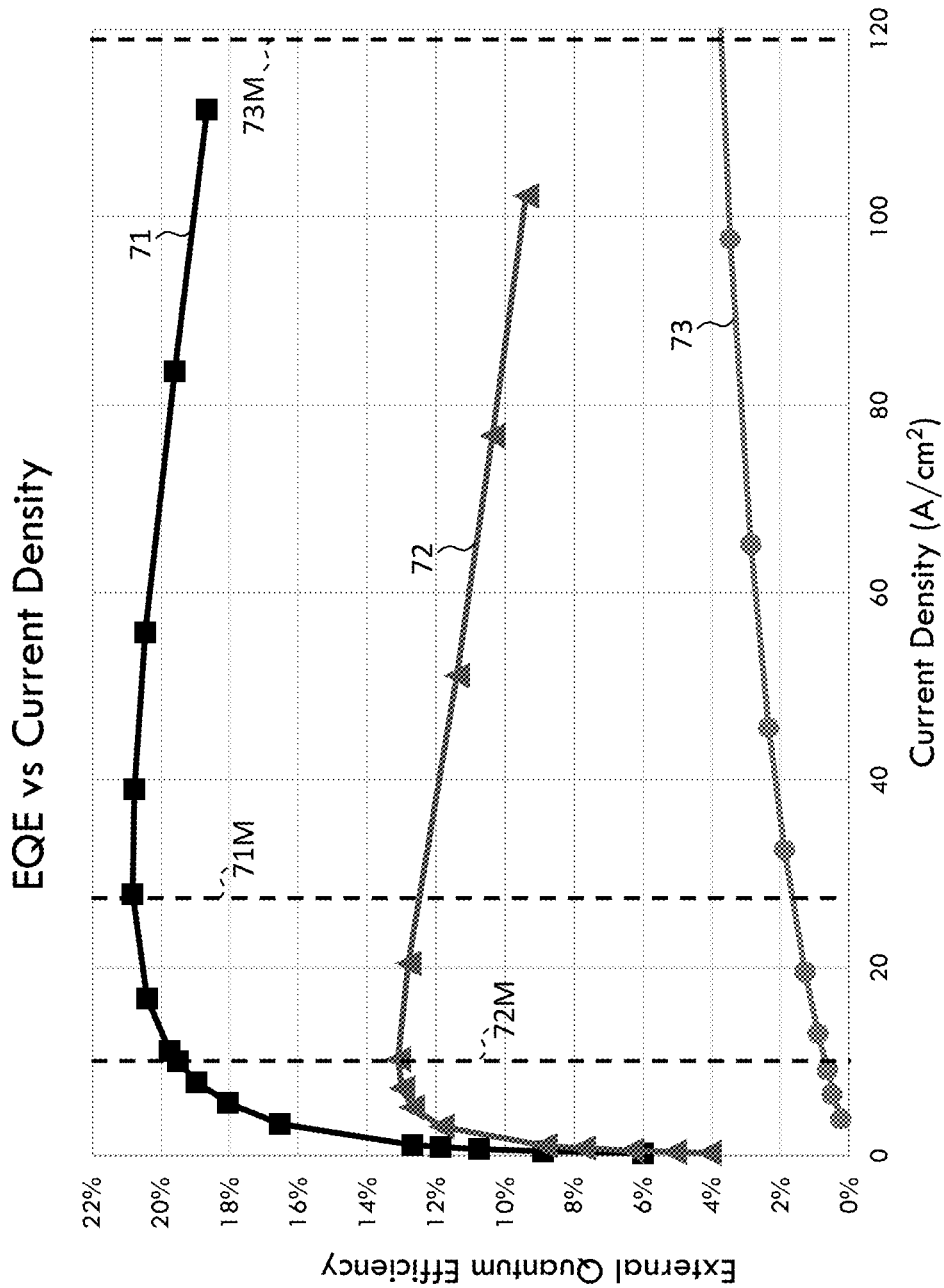
FIG. 3 is a graph illustrating iLED light output efficiency with respect to current density useful in understanding embodiments of the present disclosure.

Referring to FIG. 3, according to some embodiments of the present disclosure, first, second, and third LEDs 41, 42, 43 each have different light-output efficiencies (e.g., external quantum efficiencies) with respect to current density in the respective LED 40. According to some embodiments, the first, second, and third LEDs 41, 42, 43 can also have different preferred driving voltages, for example a forward voltage across the diode. As shown in FIG. 3, first LED 41 has a first efficiency vs. current density 71, second LED 42 has a second efficiency vs. current density 72, and third LED 43 has a third efficiency vs. current density 73. First efficiency vs. current density 71 has a first efficiency maximum 71M, second efficiency vs. current density 72 has a second efficiency maximum 72M, and third efficiency vs. current density 73 has an approximate third efficiency maximum 73M (that can be at a greater current density than is shown in FIG. 3, given the limited data set acquired and plotted in FIG. 3, e.g., of about 4-5%).

As shown in FIG. 3, second LED 42 has second efficiency maximum 72M at a lower current density than first efficiency maximum 71M. Both first and second efficiency maximums 71M and 72M are at a lower current density than third efficiency maximum 73M. Thus, according to some embodiments of the present disclosure, first LED 41 has a first efficiency 71 that is current or current density dependent, second LEDs 42 each have a second efficiency 72 that is current or current density dependent, third LEDs 43 each have a third efficiency 73 that is current or current density dependent and, as illustrated in FIG. 3, second efficiency 72 reaches a maximum 72M at a smaller current or current density than first efficiency maximum 71M, second efficiency 72 reaches a maximum 72M at a smaller current or current density than third efficiency maximum 73M, and first efficiency 71 reaches a maximum 71M at a smaller current or current density than third efficiency maximum 73M. Furthermore, second efficiency maximum 72M can be at a current or current density that is approximately one half of first efficiency maximum 71M. Therefore, if current is supplied to both first and second sub-pixels 31, 32 at first efficiency maximum 71M, and if second sub-pixel 32 comprises two second LEDs 42 electrically connected in parallel, the electrical current that passes through each second LED 42 will be one half the electrical current that passes through first LED 41 and the current density passing through second LED 42 will likewise be one half that of the current density passing through first LED 41. In this configuration, both first LED 41 and second LED 42 can operate at approximately maximum efficiency while using the same current supplied by a common current supply, improving display 99 efficiency. (Both current and current density are referenced since, if LEDs 40 are the same size, current and current density are directly related, but size need not be the same.)

As shown in FIG. 3, third LED 43 can be less efficient than first or second LEDs 41, 42 at a given current density. Moreover, according to some embodiments, third LEDs 43 can operate at a lower voltage than first or second LEDs 41, 42. For example, blue-light-emitting materials can emit light at voltages ranging from 2.5-3.7 volts, green-light-emitting materials can emit light at voltages ranging from 1.9-4 volts, and red-light-emitting materials can emit light at voltages ranging from 1.6-2 volts. Thus, first and second LEDs 41, 42 can operate effectively at a common voltage (e.g., 3.6 volts) but third LEDs 43 can require, or perform better at, a different voltage. Providing such different voltages can require additional control or power circuitry. Therefore, according to some embodiments of the present disclosure, a display controller 50 or pixel controller 52 supplies pixels 20 and sub-pixels 30 with a common voltage and multiple third LEDs 43 in third sub-pixel 33 are electrically connected in series. For example, if two third LEDs 43 are connected in series at a given voltage, each of third LEDs 43 can be driven at one half the given voltage. For example, if 3.6 volts is provided to first, second, and third sub-pixels 31, 32, 33, first and second LEDs 41, 42 are driven at 3.6 volts and two third LEDs 43 are each driven at 1.8 volts because they are electrically connected in series. Thus, in some embodiments, voltage provided to each individual third LEDs 43 is less than the voltage provided to first or second LEDs 41, 42, for example no greater than one half, one third, or one quarter of the voltage provided to first or second LEDs 41, 42 depending on the number of third LEDs 43 in third sub-pixel 33 and their electrical connection.

According to some embodiments of the present disclosure, display controller 50 provides a voltage and current to first LED 41, second LEDs 42, and third LEDs 43 and the voltage provided to each of third LEDs 43 individually is less than the voltage provided to each first or second LED 41, 42 individually. Therefore, according to some embodiments of the present disclosure, a common voltage supplied to all of first, second, and third sub-pixels 31, 32, 33 can relatively efficiently drive all of first, second, and third LEDs 41, 42, 43 and a common current supplied to all of first, second, and third sub-pixels 31, 32, 33 can relatively efficiently drive all of first, second, and third LEDs 41, 42, 43. Hence, display controller 50 or pixel controller 52 can efficiently control all of first, second, and third sub-pixels 31, 32, 33 and first, second, and third LEDs 41, 42, 43 with a single controller power supply, reducing the cost of control circuits for display 99. Because, first, second, and third LEDs 41, 42, 43 are each most efficiently driven at a single current density (although the current densities can be different for each of first, second, and third LEDs 41, 42, 43), it can be advantageous to drive pixels 20 with a temporally modulated control scheme such as pulse width modulation (PWM) so that neither the voltage nor the current is varied when driving each of first, second, and third LEDs 41, 42, 43.

Figure 4:
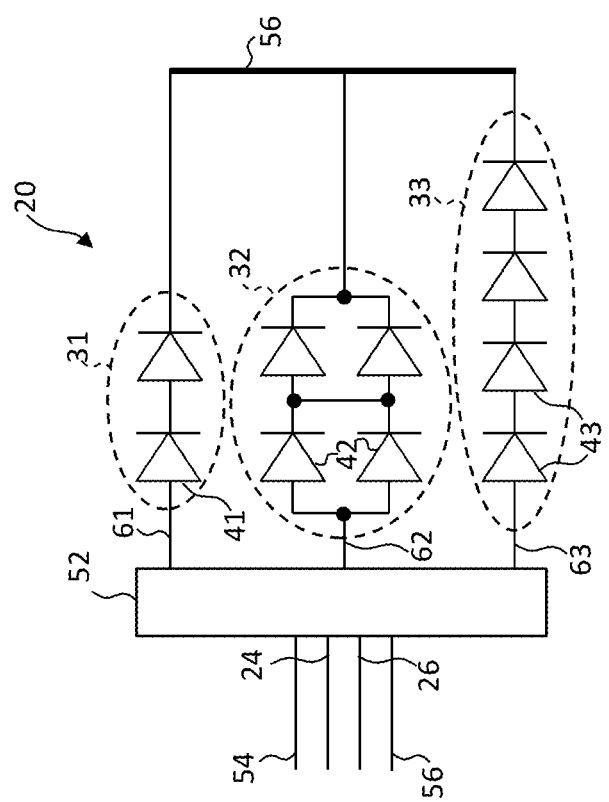
FIGS. 4-6 are schematic diagrams of pixels according to illustrative embodiments of the present disclosure.

In some embodiments of the present disclosure, first, second, and third sub-pixels 31, 32, 33 are driven at a greater voltage, for example to improve power distribution over a display substrate 10 of display 99. In some such embodiments, for example as shown in FIG. 4, first sub-pixel 31 comprises two first LEDs 41 connected in series and second sub-pixel 32 comprises four second LEDs 42 arranged in pairs. The pairs are electrically connected in series and second LEDs 42 within each pair is electrically connected in parallel. Third sub-pixel 33 can comprise four third LEDs 43 all electrically connected in a single series. Such an arrangement can be driven at twice the voltage of the configuration of FIG. 1, for example 7.2 volts, and achieve the same relative voltage for all of the first, second, and third LEDs 41, 42, 43 and the same current density distribution for first, second, and third LEDs 41, 42, 43, as shown in FIG. 1.

In some embodiments of the present disclosure, a multi-color LED display 99 comprises pixels 20. Each pixel 20 comprises a first sub-pixel 31, a second sub-pixel 32, and a third sub-pixel 33. First sub-pixel 31 comprises first light-emitting diodes (LEDs) 41 (e.g., two or more first LEDs 41) that each emit a first color of light. Second sub-pixel 32 comprises second LEDs 42 (e.g., two or more second LEDs 42 such as four second LEDs 42) that emit a second color of light different from the first color of light. Third sub-pixel 33 comprises third LEDs 43 (e.g., two or more third LEDs 43 such as four third LEDs 43) that emit a third color of light different from the first color of light and different from the second color of light. At least two first LEDs 41 are electrically connected in series; at least two second LEDs 42 are electrically connected in parallel (e.g., pairs of serially connected second LEDs 42 are electrically connected in parallel); and at least two third LEDs 43 (e.g., all of third LEDs 43) are electrically connected in series. Second sub-pixel 32 can comprise more second LEDs 42 than first sub-pixel 31 comprises first LEDs 41 and third sub-pixel 33 can comprise more third LEDs 43 than first sub-pixel 31 comprises first LEDs 41.

Figure 5:
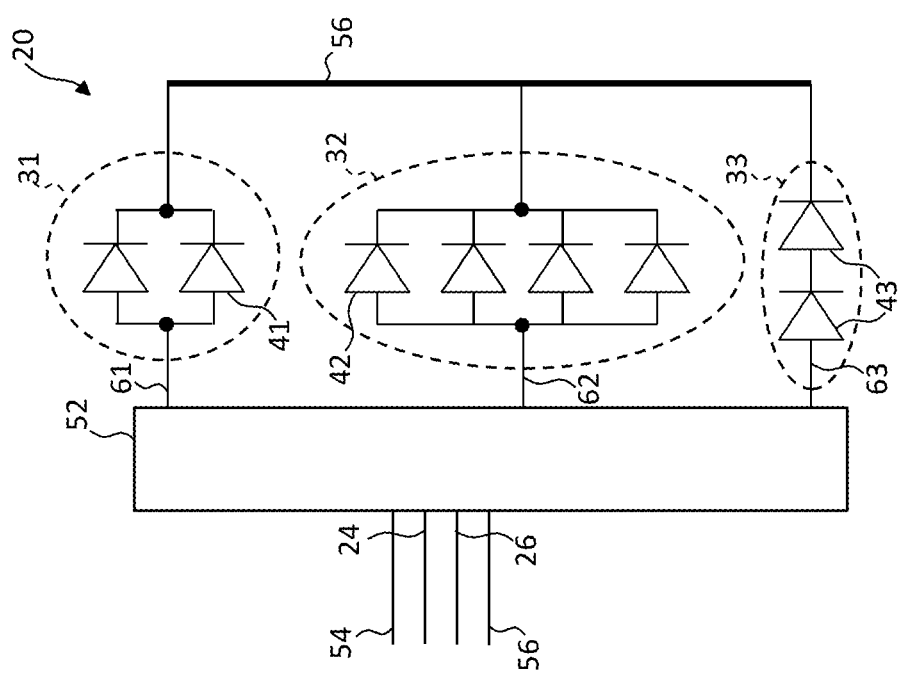

Because the third efficiency maximum 73M of third LEDs 43 can occur at much greater current density than that of either first or second efficiency maximums 71M, 72M, in some embodiments first and second sub-pixels 31, 32 are replicated in parallel within a pixel 20. In some such embodiments, for example as shown in FIG. 5, first sub-pixel 31 comprises two first LEDs 41 electrically connected in parallel and second sub-pixel 32 comprises four second LEDs 42 electrically connected in parallel. Third sub-pixel 33 can comprise two or more third LEDs 43 all electrically connected in a single series. Such an arrangement can be driven at the same voltage as the configuration of FIG. 1, for example 3.6 volts, and achieve the same relative voltage for all of first, second, and third LEDs 41, 42, 43 but the current or current density of third LEDs 43 is twice that of first LEDs 41 and four times that of second LEDs 42, improving the relative efficiency of third LEDs 43 and of display 99 as a whole. Thus, in some embodiments, electrical current provided to each of third LEDs 43 is no less than twice the current provided to each of first or second LEDs 41, 42. In some embodiments, the current density is adjusted to optimize the performance of pixels 20 in total, rather than optimizing the current density for a particular first, second, or third sub-pixel 31, 32, 33.

In some embodiments of the present disclosure, a multi-color LED display 99 comprises pixels 20. Each pixel 20 comprises a first sub-pixel 31, a second sub-pixel 32, and a third sub-pixel 33. First sub-pixel 31 comprises first light-emitting diodes (LEDs) 41 (e.g., two or more first LEDs 41)

that each emit a first color of light. Second sub-pixel 32 comprises second LEDs 42 (e.g., two or more second LEDs 42) that emit a second color of light different from the first color of light. At least two first LEDs 41 are electrically connected in parallel, more than two second LEDs 42 are electrically connected in parallel, and two or more third LEDs 43 are electrically connected in series. Second sub-pixel 32 can comprise more second LEDs 42 than first LEDs 41 in first sub-pixel 31 and third sub-pixel 33 can comprise more serially connected third LEDs 43 than serially connected first LEDs in first sub-pixel 31.

According to some embodiments of the present disclosure, and as illustrated in FIGS. 4 and 5, a multi-color display 99 comprises one first LED 41 (or multiple first LEDs 41 connected in series) and second LEDs 42 connected in parallel. Display 99 can comprise more second LEDs 42 than first LEDs 41. According to some embodiments of the present disclosure, a multi-color display 99 comprises one first LED 41 (or multiple first LEDs 41 connected in series) and third LEDs 43 connected in series. Display 99 can comprise more third LEDs 43 than first LEDs 41. Similarly, according to some embodiments of the present disclosure, multi-color LED display 99 comprises one first LED 41 (or multiple first LEDs 41 connected in parallel) and second LEDs 42 connected in parallel. Display 99 can comprise more second LEDs 42 than first LEDs 41. According to some embodiments of the present disclosure, a multi-color LED display 99 comprises one first LED 41 (or multiple first LEDs 41 connected in parallel) and third LEDs 43 connected in series. Display 99 can comprise more third LEDs 43 than first LEDs 41.

Figure 6:
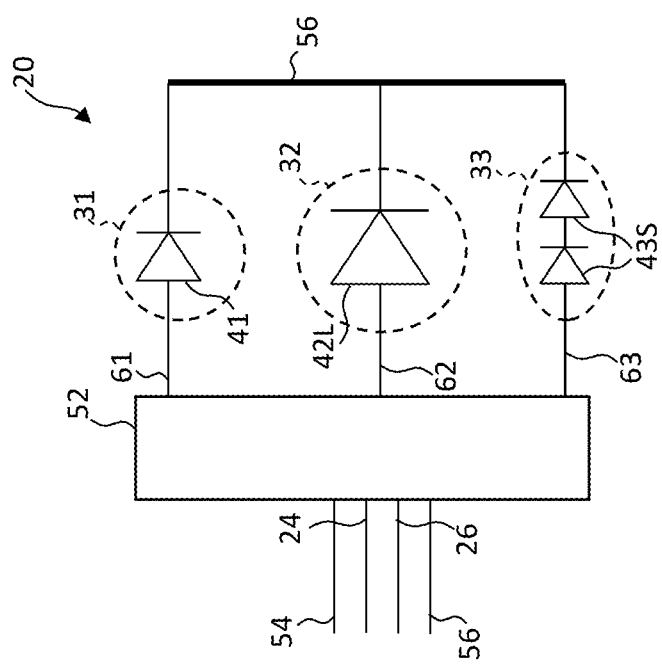

Referring to FIG. 6, in some embodiments, the efficiency of pixel 20 and relative efficiencies of sub-pixels 30 are controlled by controlling a relative area or volume of the first, second, and third LEDs 41, 42, 43, for example the light-emitting area or volume. In some embodiments of inorganic LEDs 40, for example in accordance with FIG. 3, second LEDs 42 operate most efficiently at a smaller current density than first LEDs 41 operate. A smaller current density in a single LED 40 at a given current can be achieved by increasing the relative size of the light-emitting area or volume of single LED 40. Therefore, according to some embodiments of the present disclosure, large second LEDs 42L comprise a larger light-emitting area or volume than first LEDs 41, for example large second LEDs 42L are larger than first LEDs 41 (e.g., have a larger extent over display substrate 10). Similarly, in some embodiments of inorganic LEDs in accordance with FIG. 3, third LEDs 43 operate most efficiently at a greater current density than first LEDs 41 operate. A greater current density in a single LED 40 at a given current can be achieved by decreasing the relative size of the light-emitting area or volume of single LED 40. Therefore, according to some embodiments of the present disclosure, small third LEDs 43S comprise a smaller light-emitting area or volume than first LEDs 41, for example small third LEDs 43S are smaller than first LEDs 41. According to some embodiments of the present disclosure, a ratio of the light-emitting area or volume of second LED 42 with respect to the light-emitting area or volume of first LED 41 is similar to, dependent upon, approximately equal to, or substantially the same as a ratio of first efficiency maximum 71M to second efficiency maximum 72M. Similarly, according to some embodiments of the present disclosure, a ratio of the light-emitting area or volume of third LED 43 with respect to the light-emitting area or volume of first LED 41 is similar to, dependent upon, approximately equal to, or substantially the same as the ratio of first efficiency maximum 71M to third efficiency maximum 73M. Thus, the light-emitting area or volume of pairs of differently sized LEDs 40 can be inversely related to the efficiency maximums of the pairs of LEDs 40. The relative sizes of LEDs 40 in FIG. 6 is represented by differently sized LED graphic elements. In some configurations, third LEDs 43 can each have a width and length of 8 by 15 microns, first LED 41 can have a width and length of 12 by 20 microns, and second LEDs 42 can have a width and length of 16 by 30 microns, or arithmetic multiples thereof. In some configurations, third LEDs 43 can each have a width and length of 8 by 15 microns, first LED 41 can have a width and length of 16 by 30 microns, and second LEDs 42 can have a width and length of 24 by 40 microns, or arithmetic multiples thereof. Using one first LED 41 in first sub-pixel 31, one second LED 42 in second sub-pixel 32, and one third LED 43 in third sub-pixel 33 in a pixel 20 reduces the total number of LEDs 40 in a pixel 20 and reduces the number of assembly steps.

Because some multi-color displays 99 of the present disclosure can comprise micro-LEDs in a pixel 20 spatially disposed close together, pixels 20 can provide excellent color mixing and good display resolution despite the use of multiple micro-LEDs in a pixel 20 or in first, second, or third sub-pixels 31, 32, 33. For example, in some embodiments, the unaided human visual system is not capable of spatially distinguishing first, second, and third LEDs 41, 42, 43 in a pixel 20 at a designed viewing distance, for example even if the number of first, second, and third LEDs is different in at least one pixel.

In some embodiments of the present disclosure, a multi-color LED display 99 comprises pixels 20. Each pixel 20 comprises a first sub-pixel 31, a second sub-pixel 32, and a third sub-pixel 33. First sub-pixel 31 can comprise a first light-emitting diode (LED) 41 that emits a first color of light. Second sub-pixel 32 can comprise a second larger LED 42L that emits a second color of light different from the first color of light. Third sub-pixel 33 can comprise a third smaller LED 43S that emits a third color of light different from the first color of light and different from the second color of light. First LED 41 comprises a first light-emitting area or volume, second larger LED 42L comprises a second light-emitting area or volume, and third smaller LED 43S comprises a third light-emitting area or volume. The second light-emitting area or volume is larger than the first light-emitting area or volume and the third light-emitting area or volume is smaller than the first light-emitting area or volume.

According to some embodiments of the present disclosure, a multi-color display 99 comprises a display substrate 10, an array 22 of pixels 20 disposed on display substrate 10 with a controller (e.g., a display controller 50 or pixel controller 52) connected to each of pixels 20 to control pixels 20. In some embodiments, a separate controller (e.g., pixel controller 52) is connected to each of pixel 20 to control pixel 20. According to some embodiments of the present disclosure, a multi-color inorganic light-emitting diode (iLED) pixel 20 is electrically connected to a common voltage signal 54 and a common ground signal 56 that can be provided in parallel to all pixels 20 in multi-color display 99. An LED 40 (e.g., first LED 41, second LED 42, and third LED 43) is a light-emitting device that comprises two-terminals that emits light when provided with forward-biased electrical current across the two terminals at a sufficient voltage and with sufficient current. An LED 40 can be an inorganic LED 40.

As used herein, two LEDs 40 that are serially connected are two LEDs 40 that are electrically connected in serial so that a first terminal of an LED 40 is electrically connected to a second terminal of another LED 40. Another of the terminals of each of the two LEDs 40 is electrically connected to common voltage signal 54 or common ground signal 56 and a control signal (e.g., first current control signal 61, second current control signal 62, or third current control signal 63), respectively. First terminals of two LEDs 40 that are electrically connected in parallel are connected together and second terminals of the two parallel-connected LEDs 40 are likewise connected together. The first and second terminals are electrically connected to common voltage signal 54 or common ground signal 56 and a control signal (e.g., first current control signal 61, second current control signal 62, or third current control signal 63), respectively. Both LEDs 40 are biased in the same forward direction. When one or more LEDs 40 is only one LED 40, one LED 40 being serially connected (or parallel connected) means LED 40 is simply electrically connected, by itself, to common voltage signal 54 or common ground signal 56 and a control signal (e.g., first current control signal 61, second current control signal 62, or third current control signal 63), respectively.

According to some embodiments of the present disclosure, a common power supply or power connection (common voltage signal 54) provides power at a common voltage to all of LEDs 40 in multi-color LED pixel 20. However, the common voltage is not well suited to at least one individual LED 40. For example, third LED 43 (e.g., a red iLED 43) can require a voltage of 2.075 V and operate at a current of 0.36 second LED 42 (e.g., a green iLED 42) can have a voltage of 3.308 V and operate at a current of 0.204 µA, and first LED 41 (e.g., a blue iLED 41) can have a voltage of 2.921 V and operate at a current of 0.112 µA for best efficiency. A conventional arrangement having one LED 40 of each color in each multi-color pixel 20 and a common power supply will waste 0.487 µW. In contrast, some embodiments of the present disclosure have improved efficiency (e.g., reduced lost power), depending on the relative efficiency maximums of LEDs 40 and the number of LEDs 40 electrically connected in parallel or in serial.

Figure 7:
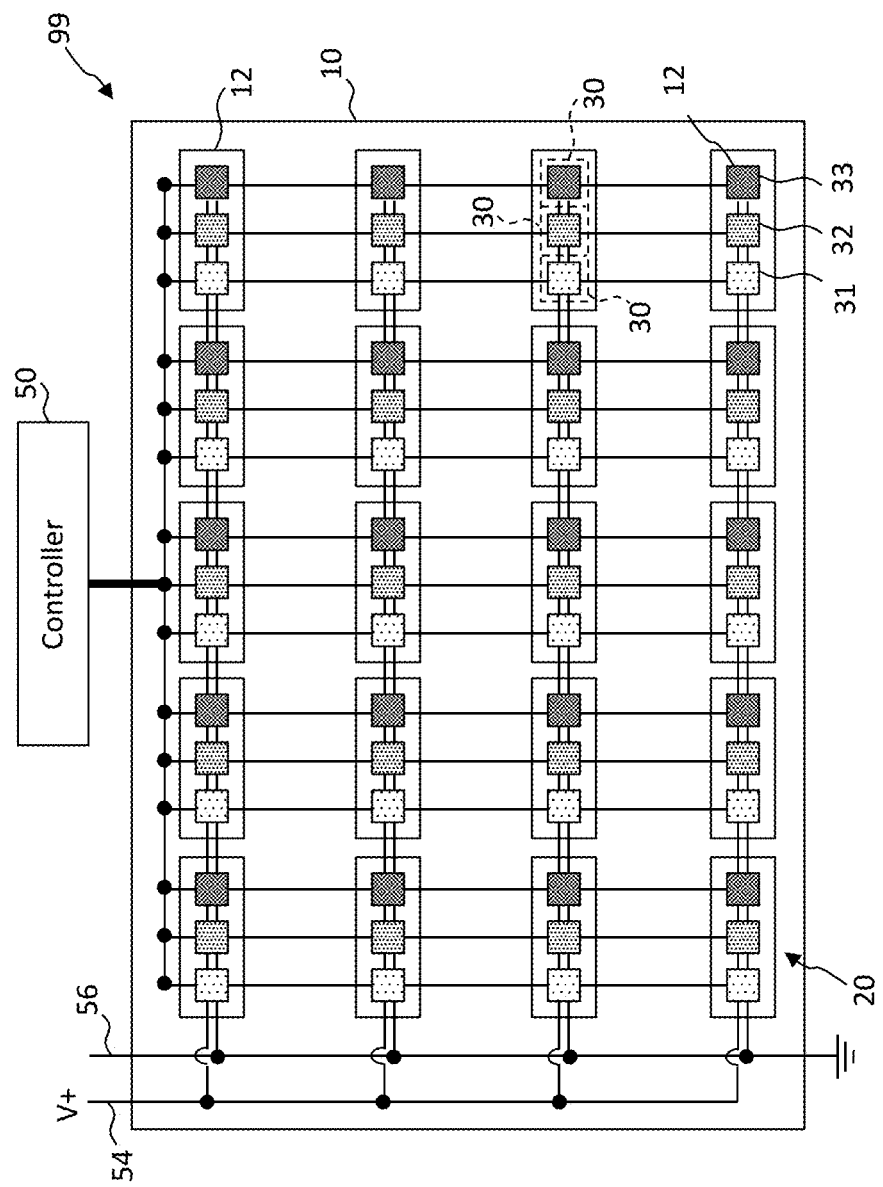
FIG. 7 is a schematic plan view of a display according to illustrative embodiments of the present disclosure.

Referring to FIG. 7, in some embodiments of the present disclosure, a multi-color display 99 includes a plurality of multi-color LED pixels 20. (In FIG. 7, color sub-pixels 30, e.g., first, second, and third sub-pixels 31, 32, 33, are illustrated, but not LEDs 40 within color sub-pixels 30.) The plurality of multi-color LED pixels 20 are arranged in a pixel array 22 on, over, or in display substrate 10. A pixel controller 52 (not shown in FIG. 7) provides control signals for controlling color sub-pixels 30 to emit a desired amount of light from each color sub-pixel 30. Each pixel 20 can be disposed on a pixel substrate 12 and each pixel substrate 12 can be disposed on display substrate 10. Sub-pixels 30 of each pixel 20 can be electrically interconnected on pixel substrate 12 at a higher resolution than pixels 20 are electrically interconnected on display substrate 10.

Figure 8:
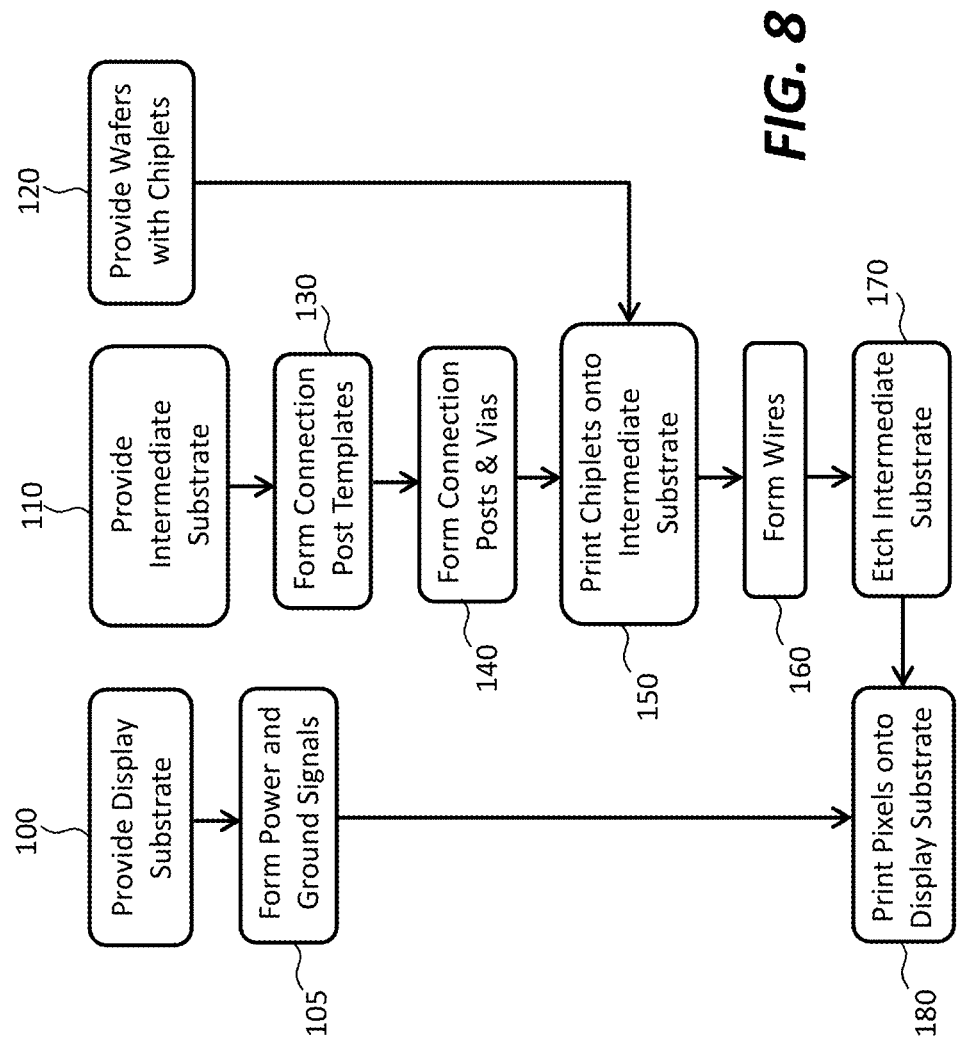
FIG. 8 is a flow chart illustrating exemplary methods of the present disclosure.
Figure 9:
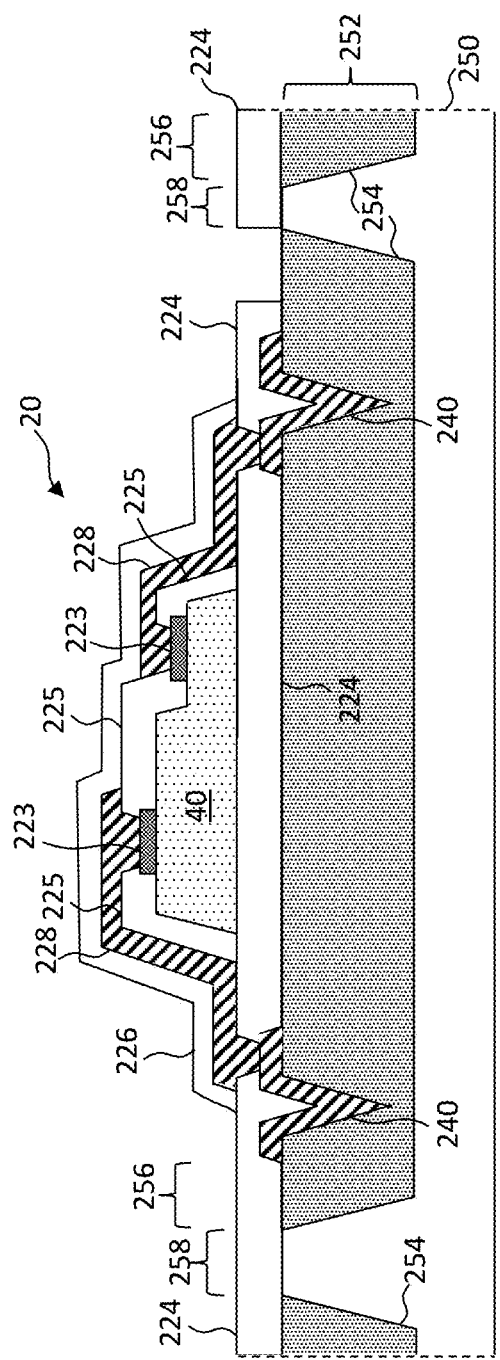
FIGS. 9-11 are cross sections of LEDs according to illustrative embodiments of the present disclosure.
Figure 10:
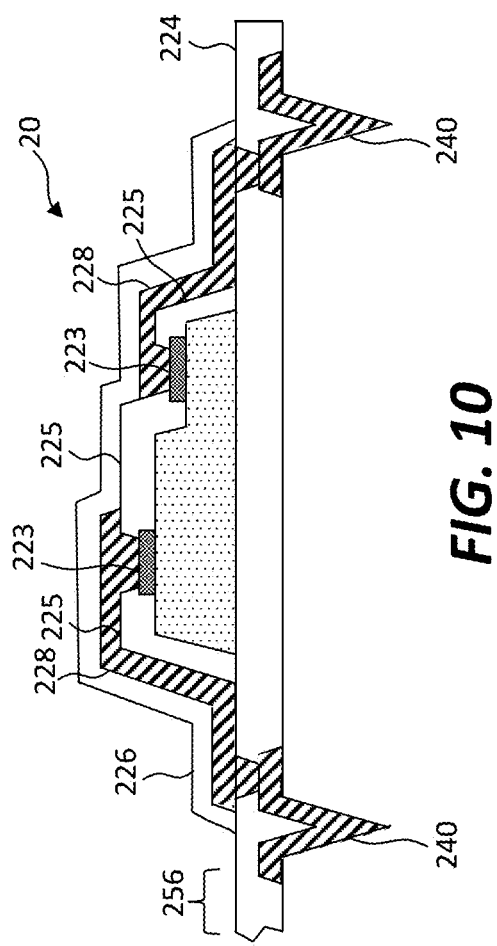
Figure 11:
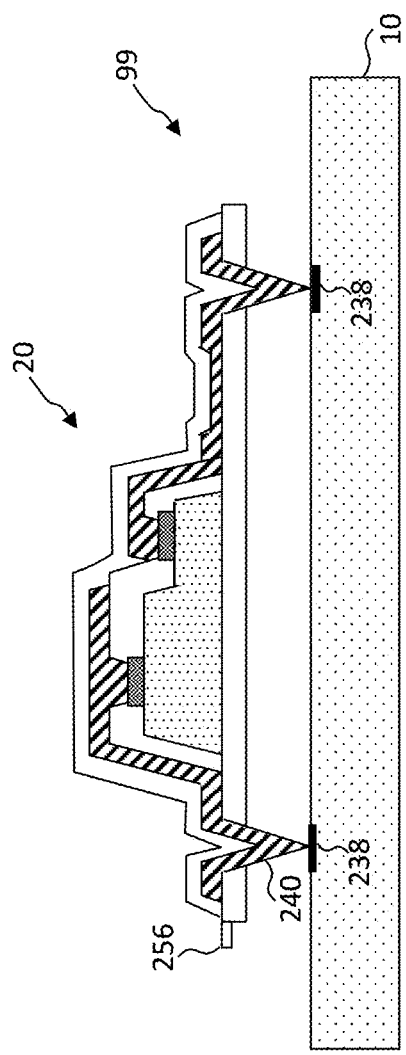
Figure 12:
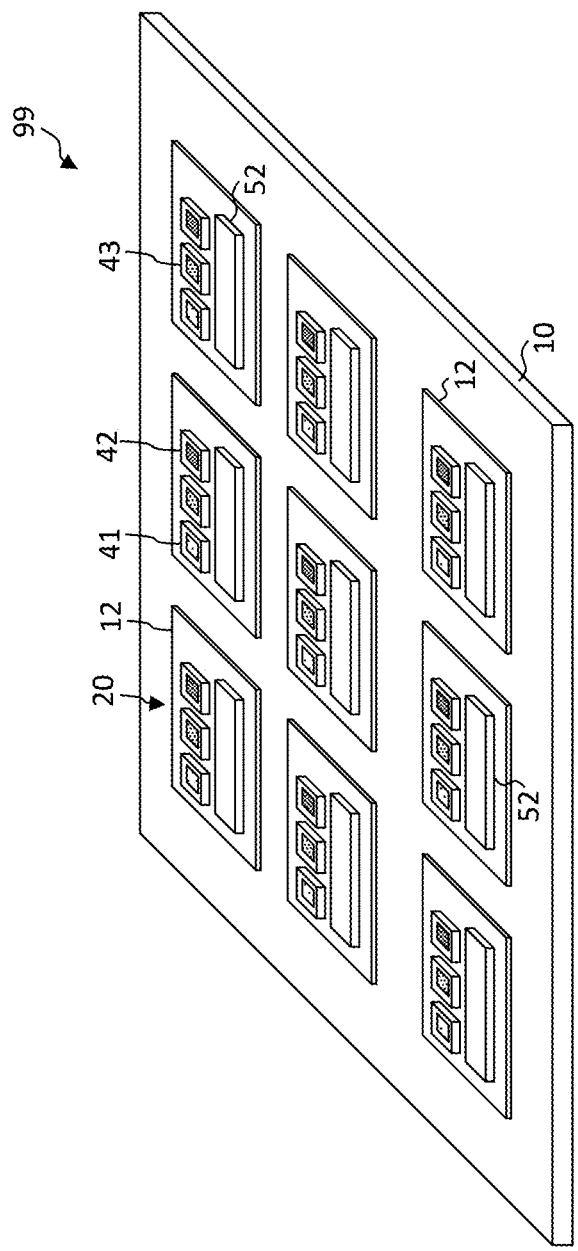
FIG. 12 is a perspective of a display according to illustrative embodiment of the present disclosure.

As shown in the flow diagram of FIG. 8, the cross sections of FIGS. 9-11, and the perspective of FIG. 12, micro-LEDs 40 (e.g., first, second, or third LEDs 41, 42, 43) can be disposed in a pixel 20 by micro-transfer printing, for example using a visco-elastic stamp with posts that each contact a micro-LED 40 connected to a source wafer anchor 258 with a tether 256 to fracture or separate tethers 256 (shown in FIG. 9), remove micro-LEDs 40 from the source wafer (shown in FIG. 10), and adhere micro-LEDs 40 to the posts. The stamp then deposits micro-LEDs 40 on the posts onto a target substrate, such as display substrate 10 or a pixel substrate 12 (shown in FIGS. 11 and 12). Such a micro-transfer printing process enables high-resolution displays 99 with pixels 20 and first, second, and third inorganic micro-LEDs 41, 42, 43 according to some embodiments of the present disclosure.

Referring to the flow diagram of FIG. 8, a method of making a multi-color display 99 includes providing a display substrate 10 in step 100. A common power (voltage) signal 54 and a common ground signal 56 are disposed on display substrate 10 (shown in FIG. 7) in step 105. Alternatively, display substrate 10 can be provided with common voltage signal 54 and common ground signal 56 in place in step 100. Referring also to FIG. 9, in step 110 an intermediate substrate 250 is provided for example as a semiconductor or glass wafer. Intermediate substrate 250 can have a patterned sacrificial layer 252 defining sacrificial portions 254 and anchors 258 with tethers 256 physically connecting pixel 20 (or LED 40) to anchor 258. Although a variety of methods can be used to form connection posts 240, in some embodiments a connection post form is made in sacrificial portion 254 for each connection post 240 in step 130, for example by etching. The connection post form can be a pyramidal depression or other depression with a suitable cross section (e.g., a conical depression). Connection posts 240 are then constructed in step 140 by forming a patterned metal layer over the form. A patterned dielectric layer 224 is formed over patterned sacrificial layer 252 with a via made through patterned dielectric layer 224 and an opening for etching sacrificial portions 254.

In step 120, one or more wafers each having an array of micro-transfer printable circuit chiplets, for example LEDs 40 or active-matrix pixel controller 52 circuits are provided. Each wafer can be made using different materials and process technologies, so that the chiplets are a heterogeneous group of chiplets. In particular, the wafers can be source wafers for the different first, second, and third (blue, green, and red) LEDs 41, 42, 43 and pixel controller 52 and be made of different compound semiconductor or single semiconductor materials.

An inorganic LED 40 (e.g., any one or more of first, second, and third LEDs 41, 42, 43) is micro-transfer printed onto patterned dielectric layer 224 from a source wafer in step 150. A patterned dielectric structure 225 is formed to insulate LEDs 40 and provide vias for LED contacts 223, and electrodes 228 are patterned over iLED contacts 223 and dielectric structure 225 in electrical contact with connection posts 240 in step 160. A plurality of inorganic LEDs 40 may be micro-transfer printed and electrically connected in steps 150 and 160. In some embodiments, wires are formed in step 160 to electrically connect the circuit chiplets to each other and connection posts 240, for example using photolithographic processes and materials. An encapsulation layer 226 can be provided to protect the structure from environmental or mechanical damage. The structures and layers illustrated in FIG. 9 can be made using integrated circuit and display industry materials and methods.

The micro-transfer printable circuit chiplets micro-transfer printed in step 150 onto intermediate substrate 250 are printed using a transfer stamp to press against the micro-transfer printable circuit chiplets on the respective source wafers to break (e.g., fracture) or separate tethers on the source wafer and adhere the circuit chiplets to the transfer stamp. The stamp is then moved to intermediate substrate 250 and the circuit chiplets pressed against and adhered to intermediate substrate 250. Intermediate substrate 250 can have an adhesive layer (not shown). In certain embodiments, after the circuit chiplets are disposed on the adhesive layer, the adhesive layer can be cured. In some embodiments, multiple multi-color inorganic light-emitting diode pixels 20, each including LEDs 40 and a pixel controller 52, are disposed on intermediate substrate 250, and can be disposed in common steps, for example micro-transfer printing many LEDs 40 from a common source wafer to intermediate substrate 250 in one printing procedure or micro-transfer printing many pixel controllers 52 from a common source wafer to intermediate substrate 250 in one printing procedure.

In step 170, sacrificial portions 254 of intermediate substrate 250 are etched to release full-color pixels 20 from intermediate substrate 250 (as shown in FIG. 10) and full-color pixels 20 are, in turn, micro-transfer printed in step 180 onto display substrate 10. Tether 256 is illustrated as fractured in FIG. 10. As shown in FIG. 11, connection posts 240 are electrically connected to display contact pads 238 electrically connected to or part of common power, ground signals 54, 56 or control signals on display substrate 10 (shown in FIG. 7). In general, sacrificial portions 254 can be etched to form tethers 256 connecting LED 40 or other pixel component, such as pixel controller 52 to anchor 258 and a gap between the circuit element and the source wafer, enabling the circuit element to be micro-transfer printed with the transfer stamp by fracturing tethers 256 to adhere the circuit element to the stamp, transporting the stamp to a destination substrate such as the display substrate 10, and pressing the circuit elements to the destination substrate to adhere the circuit elements to the destination substrate. LEDs 40, pixels 20, or other pixel component, such as pixel controller 52, can be connected to intermediate substrate 250 by one or more tethers 256, each of which is broken (e.g., fractured) or separated during micro-transfer printing. Sacrificial portions 254 can be, for example, an oxide layer or a designated anisotropically etchable portion of the source wafer, or, once etched, the gap between the circuit element and the substrate or wafer.

In some embodiments of the present disclosure, and as illustrated in FIG. 12, a plurality of pixels 20 is provided on display substrate 10 to form a multi-color display 99. At least some of pixels 20 can be provided in common steps and at the same time in a common micro-transfer printing step.

Micro-transfer printed chiplets, for example LEDs 40 or active-matrix pixel control circuits, on intermediate substrate 250 can form a full-color pixel 20 including LEDs 40 that are controlled by pixel controller 52 with control signals. The control signals can be adapted to control LEDs 40 to emit the desired amount of light from each color sub-pixel 30, for example using pulse-width modulation. Each of LEDs 40 or pixel controller 52 can be micro-transfer printed to intermediate substrate 250 or, if intermediate substrate 250 is a semiconductor substrate, a control circuit for controlling LEDs 40 can be formed in the semiconductor substrate. In some embodiments, a method of the present disclosure can include providing an intermediate substrate 250, micro-transfer printing LEDs 40 from one or more source substrates to intermediate substrate 250 to form a full-color LED pixel 20. Full-color LED pixels 20 on intermediate substrate 250 can then be micro-transfer printed to a display substrate 10 to form a multi-color display 99.

According to some embodiments of the present disclosure, display substrate 10 is a substrate having substantially parallel opposing sides, on, over, or in one of which color pixels 20 are disposed. Display substrate 10 can be a glass, polymer, ceramic, or metal substrate having at least one side suitable for constructing electrical conductors. Display substrate 10 can have a thickness, for example, from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm) or larger and can be, but is not necessarily, transparent (e.g., having at least 50% transparency).

Common power and ground signals 54, 56 can be made using photolithographic, printed circuit board, inkjet, or display techniques and materials, for example using copper, aluminum, or silver materials to form patterned electrical conductors that conduct electrical control and power signals 54 to pixels 20 to enable pixels 20 to display information, for example an image. The electrical conductors can be electrically conductive metal wires formed, or disposed on, display substrate 10 using, for example, photolithographic methods, tools, and materials. Similarly, electrodes 228 can be made using photolithographic methods, tools, and materials.

Intermediate substrate 250 can also be glass or plastic or can be a semiconductor, such as silicon. Intermediate and display substrates 250, 10 can be transparent or opaque and, if transparent, light emitted from LEDs 40 can be transmitted through intermediate or display substrates 250, 10, depending on the orientation and structure of intermediate or display substrates 250, 10.

The source wafers can be compound semiconductor or silicon wafers and patterned sacrificial layer 252, tethers 256, and circuit element structures can be made using photolithographic methods and materials found in the integrated circuit industries. For example, a source wafer can be GaN, InGaN, or GaAs. Inorganic light-emitting diodes 40 can be inorganic light-emitting diodes made in a semiconductor material, such as a compound semiconductor (e.g., GaN or GaAs, with or without doping). The semiconductor material can be crystalline. Any one or each of LEDs 40 can have at least one of a width from 2 to 50 µm (e.g., 2 to 5 µm, 5 to 10 µm, 10 to 20 µm, or 20 to 50 µm), a length from 2 to 50 µm (e.g., 2 to 5 µm, 5 to 10 µm, 10 to 20 µm, or 20 to 50 µm), and a height from 2 to 50 µm (e.g., 2 to 5 µm, 5 to 10 µm, 10 to 20 µm, or 20 to 50 µm).

In operation, power 54, ground 56, and control signals (e.g., row signals 24, column signals 26) are applied to electrical conductors on display substrate 10. In some embodiments, electrical conductors on display substrate 10 are in electrical contact with connection posts 240 of multi-color LED pixels 20 and supply electrical power at a desired voltage to common power signal 54, supply an electrical ground to common ground signal 56, and supply control signals to other connection posts 240. The ground, voltage, and control signals are electrically conducted by connection posts 240 and electrodes 228 to LEDs 40 and pixel controller 52 to control LEDs 40 to emit light. LEDs 40 can be controlled using passive-matrix or active-matrix methods.

Methods of forming useful micro-transfer printable structures are described, for example, in the paper "AMOLED Displays using Transfer-Printed Integrated Circuits," published in the Proceedings of the 2009 Society for Information Display International Symposium Jun. 2-5, 2009, in San Antonio Tex., US, vol. 40, Book 2, ISSN 0009-0966X, paper 63.2 p. 947 and U.S. Pat. No. 8,889,485. For a discussion of micro-transfer printing techniques see, U.S. Pat. Nos. 8,722,458, 7,622,367 and 8,506,867, the disclosures of which are hereby incorporated by reference in their entirety. Micro-transfer printing using compound micro-assembly structures and methods can also be used with the present disclosure, for example, as described in U.S. patent application Ser. No.

14/822,868, filed Aug. 10, 2015, entitled Compound Micro-Assembly Strategies and Devices, the disclosure of which is hereby incorporated by reference in its entirety. In some embodiments, pixel 20 is a compound micro-assembled device.

According to various embodiments of the present disclosure, source wafers can be provided with LEDs 40, release layers (patterned sacrificial layers 252), tethers 256, and connection posts 240 already formed, or they can be constructed during display fabrication. Similarly, any source wafers having micro-transfer printable LEDs 40 thereon can be constructed or transfer printed during display fabrication.

Connection posts 240 can be electrical connections formed on a side of a micro-transfer printable element such as LED 40, circuit element, or pixel 20 that extend generally perpendicular to a surface of the element. Such connection posts 240 can be formed from metals such as aluminum, titanium, tungsten, copper, silver, gold, or other conductive metals. In some embodiments, connection posts 240 are made of one or more high elastic modulus metals, such as tungsten. As used herein, a high elastic modulus is an elastic modulus sufficient to maintain function and structure of the connection posts 240 when pressed into a display substrate 10 electrical conductors that can include display contact pads 238.

Display substrate 10 contact pads 238 can be made of or include a relatively soft metal, such as tin, solder, or tin-based solder, to assist in forming good electrical contact with connection posts 240 and adhesion with the elements. As used herein, a soft metal may refer to a metal into which a connection post 240 can be pressed to form an electrical connection between connection post 240 and display contact pads 238. In this arrangement, display contact pads 238 can plastically deform and flow under mechanical pressure to provide a good electrical connection between connection post 240 and display contact pads 238.

In some embodiments of the present disclosure, connection posts 240 can include a soft metal and display contact pads 238 include a high elastic modulus metal. In some such configurations, connection posts 240 can plastically deform and flow under mechanical pressure to provide a good electrical connection between connection post 240 and display contact pads 238.

If an optional layer of adhesive is formed on display substrate 10, connection posts 240 can be driven through the adhesive layer to form an electrical connection with display contact pads 238 beneath the adhesive layer. In certain embodiments, the adhesive layer can be cured to more firmly adhere the element and maintain a robust electrical connection between connection posts 240 and display contact pads 238 in the presence of mechanical stress. In certain embodiments, the adhesive layer undergoes some shrinkage during the curing process that can further strengthen the electrical connectivity and adhesion between connection post 240 and display contact pads 238.

In certain embodiments of the present disclosure, connection posts 240 are in contact with, are embedded in, or pierce display contact pads 238 of the element. In some embodiments, either or both one or more of connection posts 240 and display contact pads 238 are deformed or crumpled into a non-planar shape or are deformed so that the surfaces of connection posts 240 and display contact pads 238 change shape on contact with each other. The deformation or crumpling can improve the electrical connection between connection posts 240 and display contact pads 238 by increasing the surface area that is in contact between connection posts 240 and display contact pads 238. To facilitate deformation, in some embodiments, connection posts 240 have a composition softer than that of display contact pads 238 or display contact pads 238 have a composition softer than connection posts 240.

Micro-transfer printable elements can be constructed using foundry fabrication processes used in the art. Layers of materials can be used, including materials such as metals, oxides, nitrides and other materials used in the integrated-circuit art. Each element can be or include a complete semiconductor integrated circuit and can include, for example, transistors. The elements can have different sizes, for example, from 1000 square microns to 10,000 square microns, 100,000 square microns, or 1 square mm, or larger, and can have one of a range of aspect ratios, for example at least 1:1, 2:1, 5:1, or 10:1. The elements can be rectangular or can have other shapes.

Some embodiments of the present disclosure provide advantages over other printing methods described in the prior art. By employing connection posts 240 and a printing method that provides micro-transfer printable element on a destination substrate and connection posts 240 adjacent to the destination substrate, a low-cost method for printing elements in large quantities over a destination substrate (e.g., display substrate 10) is provided. Furthermore, in some embodiments, additional process steps for electrically connecting the micro-transfer printable elements to the destination substrate are obviated.

An element source wafer and micro-transfer printable elements, micro-transfer printing stamps, and destination substrates can be made separately and at different times or in different temporal orders or locations and provided in various process states.

The method of some embodiments of the present disclosure can be iteratively applied to a single or multiple destination substrates. By repeatedly transferring sub-arrays of micro-transfer printable elements from a transfer stamp to a destination substrate and relatively moving the transfer stamp and destination substrates between stamping operations size of the selected micro-transfer printable elements in the transferred sub-array between each transfer of micro-transfer printable elements, an array of micro-transfer printable elements formed at a high density on a source wafer (e.g., intermediate wafer 250) can be transferred to a destination substrate (e.g., display substrate 10) at a much lower density. In practice, the source wafer is likely to be expensive, and forming micro-transfer printable elements with a high density on the source wafer will reduce the cost of the micro-transfer printable elements, especially as compared to micro-transfer printable elements on the destination substrate.

In particular, in a case wherein active micro-transfer printable elements are or include an integrated circuit formed in a crystalline semiconductor material, the integrated circuit substrate provides sufficient cohesion, strength, and flexibility that it can adhere to the destination substrate without breaking as the transfer stamp is removed.

In comparison to thin-film manufacturing methods, using densely populated source substrate wafers and transferring micro-transfer printable elements to a destination substrate that requires only a sparse array of micro-transfer printable elements located thereon does not waste or require active layer material on a destination substrate. The present disclosure can also be used in transferring micro-transfer printable elements made with crystalline semiconductor materials that have higher performance than thin-film active components. Furthermore, the flatness, smoothness, chemical stability, and heat stability requirements for a destination substrate used in embodiments of the present disclosure may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST 10 display substrate
12 pixel substrate
20 pixels
22 array
24 row wire/row signal
26 column wire/column signal
30 sub-pixel
31 first sub-pixel
32 second sub-pixel
33 third sub-pixel
40 LED/iLED/micro-LED
41 first LED/blue LED
42 second LED/green LED
42L large second LED
43 third LED/red LED
43S small third LED
50 display controller
52 pixel controller
54 power/voltage signal
56 ground
61 first current control signal
62 second current control signal
63 third current control signal
71 first efficiency vs. current density/efficiency
71M first efficiency maximum
72 second efficiency vs. current density/efficiency
72M second efficiency maximum
73 third efficiency vs. current density/efficiency
73M third efficiency maximum
99 display
100 provide display substrate step
105 form voltage and ground signals step
110 provide intermediate substrate step
120 provide wafer with chiplets step
130 form connection post templates step
140 form connection posts and vias step
150 print chiplets onto intermediate substrate step
160 form wires step
170 etch intermediate substrate step
180 print pixels onto display substrate step
223 LED contact
224 patterned dielectric layer
225 dielectric structure
226 encapsulation layer
228 electrode
238 display contact pad
240 connection post
250 intermediate substrate
252 patterned sacrificial layer
254 sacrificial portion
256 tether
258 anchor

The invention claimed is:

1. A multi-color LED display, comprising:
pixels, each of the pixels comprising a first sub-pixel, a second sub-pixel, and a third sub-pixel, the first sub-pixel comprising first light-emitting diodes (LEDs) that emit a first color of light, the second sub-pixel comprising second LEDs that emit a second color of light different from the first color of light, and the third sub-pixel comprising third LEDs that emit a third color of light different from the first color of light and different from the second color of light,
wherein at least two of the first LEDs are electrically connected in parallel, more than two of the second LEDs are electrically connected in parallel, and more than two of the third LEDs are electrically connected in series,
and wherein the second sub-pixel comprises more second LEDs than first LEDs in the first sub-pixel and the third sub-pixel comprises more third LEDs than first LEDs in the first sub-pixel.

2. A multi-color LED display, comprising:
pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light,
wherein the first LED has a first light-emitting area and volume, the second LED has a second light-emitting area and volume, and the third LED has a third light-emitting area and volume, and
at least one of the second light-emitting area and volume is larger than the first light-emitting area and volume, respectively, and at least one of the third light-emitting area and volume is smaller than the first light-emitting area and volume, respectively, wherein the first LED is more light-output efficient at a given current or current density than the second LED and the second LED is more light-output efficient at the given current or current density than the third LED.

3. The multi-color display of claim 2, wherein (i) a ratio of at least one of the second light-emitting area and volume to the first light-emitting area and volume, respectively, is dependent on a ratio of a first light-output efficiency maximum of the first LED to a second light-output efficiency maximum of the second LED, (ii) a ratio of at least one of the second light-emitting area and volume to the first light-emitting area and volume, respectively, is dependent on the ratio of the first light-output efficiency maximum to the second light-output efficiency maximum, or (iii) both (i) and (ii).

4. The multi-color LED display of claim 2, wherein the first LED, the second LED, and the third LED are inorganic micro-LEDs with at least one of a width and a length that is no greater than 500 microns.

5. The multi-color LED display of claim 4, wherein the first LED, the second LED, and the third LED are inorganic micro-LEDs with at least one of a width and a length that is no greater than 200 microns.

6. The multi-color display of claim 2, wherein the first LED is a blue LED that emits blue light, the second LED is green LED that emits green light, and the third LED is a red LED that emits red light.

7. The multi-color display of claim 2, comprising a display controller electrically connected to the pixels that is operable to control the first LED, the second LED, and the third LED.

8. The multi-color display of claim 7, wherein the controller is operable to provide a current source at a fixed voltage to the first LED, the second LED, and the third LED, and wherein a quantity of light emitted by the first LED, the second LED, and the third LED is controlled by the current provided to the first LED, the second LED, and the third LED, respectively.

9. The multi-color LED display of claim 2, comprising:
a display substrate on, in, or over which the pixels are disposed; and
a controller electrically connected to each of the pixels that is operable to control the pixels.

10. A pixel comprising:
a first sub-pixel comprising a first inorganic light-emitting diode (LED) that emits a first color of light;
a second sub-pixel comprising second inorganic LEDs that emit a second color of light different from the first color of light; and
a third sub-pixel comprising third inorganic LEDs that emit a third color of light different from the first color of light and different from the second color of light,
wherein the second LEDs are electrically connected in parallel and the third LEDs are electrically connected in series,
wherein the first LED is more light-output efficient at a given current or current density than any of the second LEDs and each of the second LEDs is more light-output efficient at the given current or current density than any of the third LEDs.

11. A multi-color LED display, comprising:
pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light,
wherein the first LED has a first light-emitting area and volume, the second LED has a second light-emitting area and volume, and the third LED has a third light-emitting area and volume,
wherein at least one of the second light-emitting area and volume is larger than the first light-emitting area and volume, respectively, and at least one of the third light-emitting area and volume is smaller than the first light-emitting area and volume, respectively, and
wherein the first LED has a first efficiency that is current or current density dependent, the second LED has a second efficiency that is current or current density dependent, and the second efficiency of the second LED reaches a maximum at a smaller current or current density than the first efficiency.

12. A multi-color LED display, comprising:
pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light,
wherein the first LED has a first light-emitting area and volume, the second LED has a second light-emitting area and volume, and the third LED has a third light-emitting area and volume,
wherein at least one of the second light-emitting area and volume is larger than the first light-emitting area and volume, respectively, and at least one of the third light-emitting area and volume is smaller than the first light-emitting area and volume, respectively, and
wherein the second LED has a second efficiency that is current or current density dependent, the third LED has a third efficiency that is current or current density dependent, and the second efficiency of the second LED reaches a maximum at a smaller current or current density than the third efficiency of the third LED.

13. A multi-color LED display, comprising:
pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light,
wherein the first LED has a first light-emitting area and volume, the second LED has a second light-emitting area and volume, and the third LED has a third light-emitting area and volume,
wherein at least one of the second light-emitting area and volume is larger than the first light-emitting area and volume, respectively, and at least one of the third light-emitting area and volume is smaller than the first light-emitting area and volume, respectively, and wherein the first LED has a first efficiency that is current dependent, the third LED has a third efficiency that is current dependent, and the first efficiency reaches a maximum at a smaller current than the third efficiency of the third LED.

14. A multi-color LED display, comprising:

pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light, and a display controller electrically connected to the pixels that is operable to control the first LED, the second LED, and the third LED, wherein the first LED has a first light-emitting area and volume, the second LED has a second light-emitting area and volume, and the third LED has a third light-emitting area and volume, wherein at least one of the second light-emitting area and volume is larger than the first light-emitting area and volume, respectively, and at least one of the third light-emitting area and volume is smaller than the first light-emitting area and volume, respectively, and wherein a voltage provided to the third LED is less than a voltage provided to the first LED or to each of the second LEDs.

15. The multi-color display of claim 14, wherein a voltage provided to the third LED is no greater than one half a voltage provided to the first LED or to each of the second LEDs.

16. A multi-color LED display, comprising:

pixels, each of the pixels comprising a first sub-pixel, a second sub-pixel, and a third sub-pixel, the first sub-pixel comprising a first inorganic light-emitting diode (LED) that emits a first color of light, the second sub-pixel comprising a second inorganic LED that emits a second color of light different from the first color of light, and the third sub-pixel comprising a third inorganic LED that emits a third color of light different from the first color of light and different from the second color of light, and a display controller electrically connected to the pixels that is operable to control the first LED, the second LED, and the third LED, wherein the first LED has a first light-emitting area and volume, the second LED has a second light-emitting area and volume, and the third LED has a third light-emitting area and volume, wherein at least one of the second light-emitting area and volume is larger than the first light-emitting area and volume, respectively, and at least one of the third light-emitting area and volume is smaller than the first light-emitting area and volume, respectively, and wherein a current provided to the third LED is no less than twice a current provided to the first LED or to the second LED.

* * * * *